United States Patent [19]
Nakasuji

[11] Patent Number: 5,831,270
[45] Date of Patent: Nov. 3, 1998

[54] MAGNETIC DEFLECTORS AND CHARGED-PARTICLE-BEAM LITHOGRAPHY SYSTEMS INCORPORATING SAME

[75] Inventor: Mamoru Nakasuji, Yokohama, Japan

[73] Assignee: Nikon Corporation, Tokyo, Japan

[21] Appl. No.: 801,530

[22] Filed: Feb. 18, 1997

[30] Foreign Application Priority Data

Feb. 19, 1996 [JP] Japan ................................ 8-030253

[51] Int. Cl.⁶ ................................................. H01J 37/30
[52] U.S. Cl. ............................... 250/396 ML; 250/492.2
[58] Field of Search ...................... 250/396 ML, 396 R, 250/492.2, 492.22, 492.23

[56] References Cited

U.S. PATENT DOCUMENTS

| | | | |
|---|---|---|---|
| 3,911,321 | 10/1975 | Wardly | 250/396 ML |
| 4,090,077 | 5/1978 | Anger | 250/396 ML |
| 4,251,728 | 2/1981 | Pfeiffer et al. | 250/396 ML |
| 4,362,945 | 12/1982 | Riecke | 250/396 ML |
| 4,929,838 | 5/1990 | Yasuda et al. | 250/396 ML |
| 5,276,331 | 1/1994 | Oae et al. | 250/396 ML |

*Primary Examiner*—Kiet T. Nguyen
*Attorney, Agent, or Firm*—Klarquist Sparkman Campbell Leigh & Whinston, LLP

[57] ABSTRACT

Magnetic deflectors for charged particle beams are provided. The magnetic deflectors comprise at least one pair of coils to provide high deflection sensitivity over large regions of uniform deflection without increasing the size of the magnetic core used by the deflectors. Charged-particle-beam lithography systems using such deflectors are also disclosed.

32 Claims, 4 Drawing Sheets

MAGNETIC DEFLECTORS AND CHARGED-PARTICLE-BEAM LITHOGRAPHY SYSTEMS INCORPORATING SAME

FIELD OF THE INVENTION

The present invention pertains to magnetic deflectors that deflect charged particle beams and charged-particle-beam lithography systems using these deflectors. Lithography systems using such deflectors have high transfer efficiencies even for high-resolution integrated circuit patterns for circuits such as 4 Gbyte or higher DRAMs.

BACKGROUND OF THE INVENTION

Improved charged-particle-beam lithography systems transfer high resolution patterns from a mask to a substrate with high throughput, i.e patterns can be transferred rapidly. Such transfer systems have generally been batch transfer systems. These systems transfer a pattern of one die (usually corresponding to the extent of one integrated circuit) or a plurality of dies from a mask to a substrate such as a semiconductor wafer. The substrate is typically coated with a resist material that is sensitive to the charged particle beam. The generation of the mask for batch transfer systems is difficult and controlling pattern aberrations in a charged-particle-beam scanning system over a large field containing one or more dies is also difficult.

Devices using multiple field transfer have also been used. These devices select and transfer patterns from a region of the mask, transferring the patterns of the entire mask by transferring one or more of these smaller regions. The mask regions ("subfields") are selected so that the aberrations of the charged-particle-beam scanning system are sufficiently small for these fields. The charged particle beam irradiates a subfield and the system then transfers the patterns within the subfield onto a substrate.

Figures 5, 6:
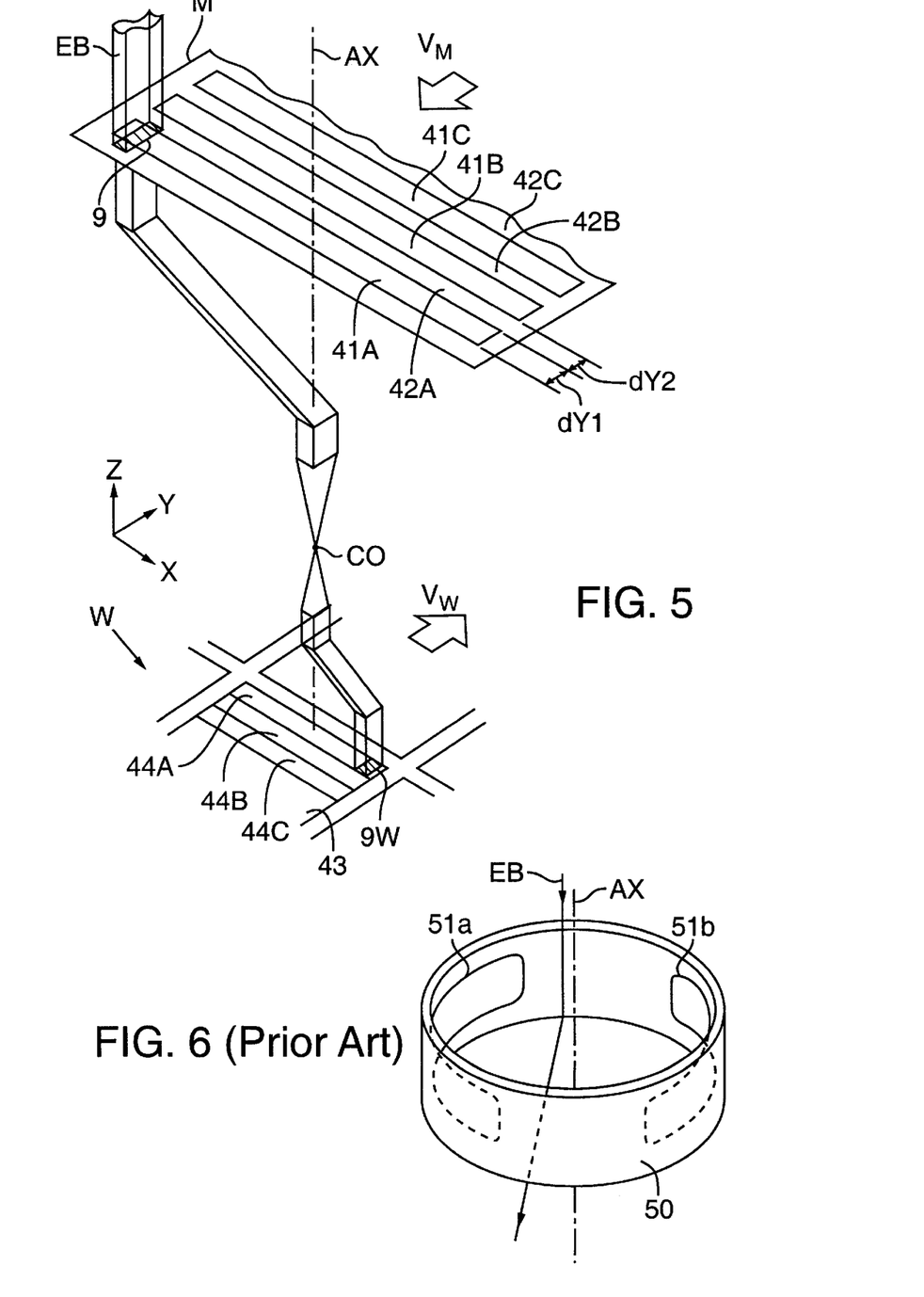
FIG. 5 shows a trajectory of a charged particle beam which transfers patterns from a mask onto a wafer while the mask and wafer are scanned.
FIG. 6 is an example of a conventional magnetic deflector.

A saddle or toroidal magnetic deflector is typically used to direct the beam to the subfields. FIG. 6 shows a conventional saddle magnetic deflector used in an electron beam scanning system. A pair of coils 51a and 51b is attached to the inside of a core 50 which is a cylindrical shell of ferrite. The center of the core 50 is along an optical axis AX of the charged-particle-beam system. The coils 51a and 51b are placed facing each other symmetrically with respect to the optical axis AX. An electrical current flowing in the coils 51a and 51b generates a magnetic field that passes through the coils 51a and 51b. This magnetic field deflects an electron beam EB traveling along the optical axis AX and inside the core 50.

The objective lens of a multiple-field transfer system should have small aberrations over as large a main field as possible. Two types of objective lenses are well-known for this application. The first is a symmetrical magnetic doublet and the second is a PREVAIL (Projection Lithography with Variable Axis Immersion Lens) objective. The symmetrical magnetic doublet consists of an upper lens and a lower lens; the upper and lower lenses satisfy symmetry conditions which reduce aberrations. The PREVAIL objective reduces aberrations over a wide field using a magnetic deflector that moves an axis of the objective. The PREVAIL magnetic deflector directs the charged particle beam so that, even for subfields displaced from the axis of the projection lens, the beam propagates along the lens axis. The PREVAIL objective uses a so-called immersion lens wherein the pattern to be transferred is placed inside the lens.

Systems using toroidal or saddle magnetic deflectors have the disadvantage that such deflectors do not have a sufficiently large region of uniform deflection sensitivity (i.e., the deflection angle changes with changes in position of the beam relative to the coils). The size of the region of uniform deflection increases with increasing diameter and length of the core. However, increasing the core diameter to enlarge the region of uniform deflection decreases deflection sensitivity. Large deflections remain problematic because of the reduced deflection sensitivity; as a result, deflection distortions arise. If the length of the core is increased, the length of the deflector along the optical axis increases. The distance between the mask and the substrate also lengthens and pattern blurring and loss of resolution occur because of space-charge effects.

In addition, when using a symmetrical magnetic doublet as an objective in a conventional multiple-field charged-particle-beam lithography system, the distance between the mask and the substrate is not short enough to reduce aberrations such as field curvature or astigmatism while transferring the subfield. Similarly, even when a PREVAIL objective is used, the distance between the mask and the substrate is insufficiently short to reduce remaining distortions in transferring the subfield. In addition, if the distance between the mask and the substrate is long, the transferred pattern is blurred because of space-charge effects in the charged particle beam. Therefore, high-resolution pattern transfers must use low beam current, causing low throughput.

SUMMARY OF THE INVENTION

In view of the foregoing shortcomings of the prior art, one object of the present invention is to overcome these problems and to provide magnetic deflectors having high deflection sensitivity over a large region of uniform deflection without increasing the diameter or length of the core. These magnetic deflectors are applicable to lithography systems operable to move the mask and substrate in a continuous or stepped manner.

A second object of the present invention is to provide a charged-particle-beam lithography system that permits a small distance between the mask and the substrate while controlling distortion in the transferred patterns.

A preferred embodiment of the present invention provides a magnetic deflector comprising a pair of coils placed parallel to each other symmetrically about a charged-particle-beam optical axis. The coils deflect a charged particle beam passing between the coils. Electrical currents in the coils determine the magnitude of the magnetic field generated by the coils and thus determine the magnitude and direction of the deflection of the charged particle beam. Generally, equal currents flow in the same direction in the pair of coils.

Such coils have several advantages when used as deflectors in pattern-transfer systems. Because the magnetic field produced by the coils is uniform over a large region, there is a large region of uniform deflection sensitivity. In addition, reducing the distance between the pair of coils increases the magnetic field and increases deflection sensitivity.

The deflection sensitivity and uniformity of a pair of coils (primary coils) are further improved with the addition of auxiliary coils. In this case, one or more auxiliary coils, having areas smaller than the areas of the primary coils, are placed in proximity to one or both of the primary coils. One embodiment uses two pairs of auxiliary coils, one pair placed in proximity to each of the primary coils. The two auxiliary coils associated with a primary coil are placed in planes parallel to the plane containing the primary coil. The auxiliary coils are more distant from the optical axis than the primary coil. These two coils are further placed so that they are coplanar. In addition, the two pairs of auxiliary coils are symmetrically placed with respect to the optical axis and the primary coils.

Charged-particle-beam lithography systems using such magnetic deflectors can comprise scanning systems operable to move a charged particle beam continuously or step-wise in a plane parallel to the plane of the primary coils. The scanning system scans the charged particle beam to a subfield of a mask defining a pattern that is then transferred to a sensitive substrate.

The charged particle beam may require large deflections in order to scan all the subfields on the mask. The magnetic deflectors of the present invention can provide such large deflections. The deflectors also provide uniform deflection, thereby preserving the accuracy of the transferred patterns.

The foregoing and other objects, features, and advantages of the invention will become more apparent from the following detailed description of a preferred embodiment which proceeds with reference to the accompanying drawings.

DETAILED DESCRIPTION OF PREFERRED EMBODIMENTS

Figure 1:
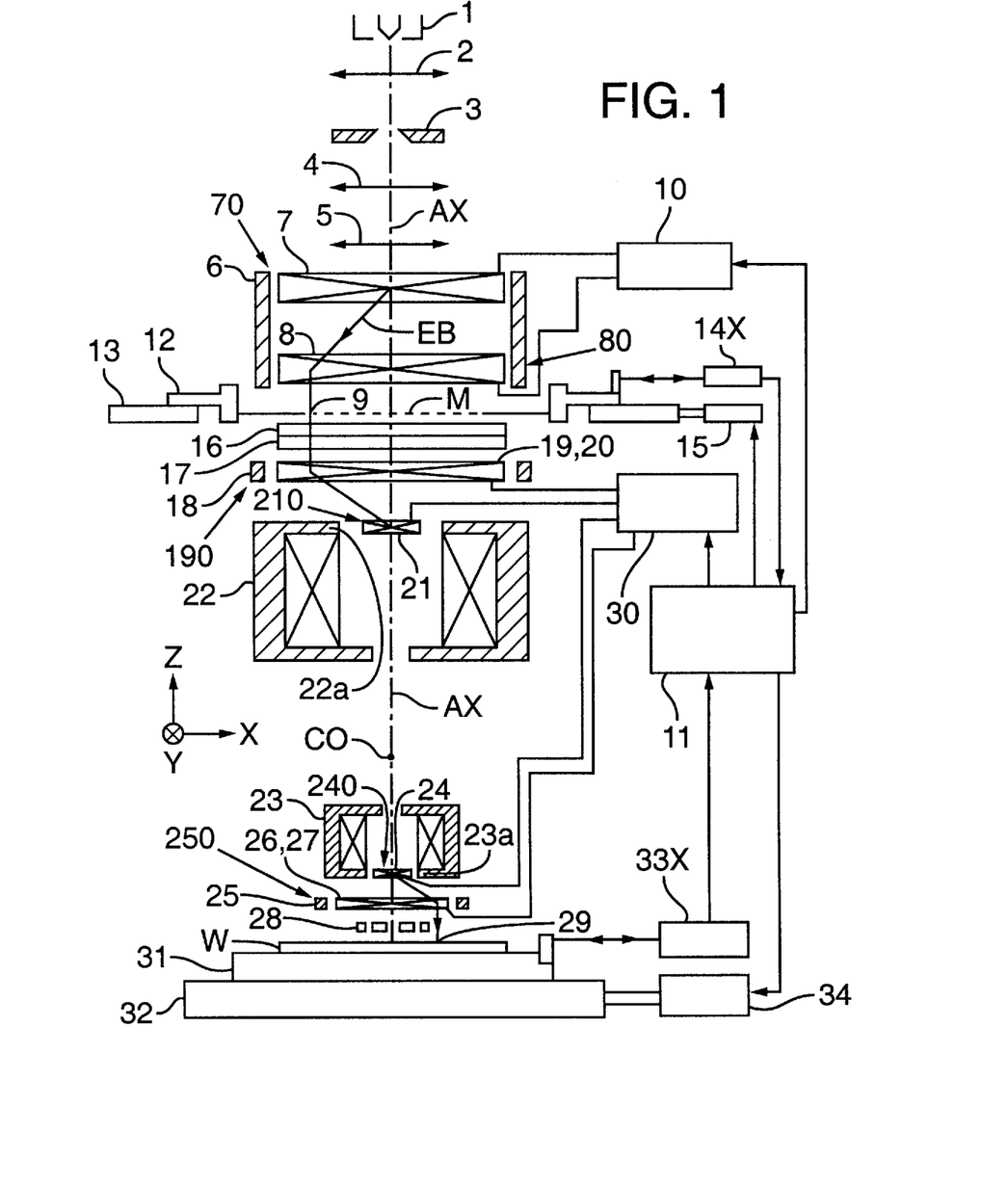
FIG. 1 is a multiple-field electron beam lithography system.

FIG. 1 shows a preferred embodiment of a multiple-field electron-beam lithography system according to the invention. For purposes of describing the FIG. 1 embodiment, coordinate axes are chosen as shown in FIG. 1. The Z-axis is parallel to the optical axis AX of an electron-beam optical system, the Y-axis is perpendicular to the Z-axis and to the plane of the page of FIG. 1, and the X-axis is perpendicular to both the Y and Z-axes. Also, although the FIG. 1 embodiment is adapted for use with an electron beam, it will be understood that an electron beam is a representative example of a charged particle beam, and that other charged particle beams can be used such as ions or protons.

An electron gun 1 emits electrons. A condenser lens 2 captures some of these electrons and directs them toward a beam-forming aperture 3. The aperture 3 is preferably rectangular with its longer sides extending in the Y direction. Condenser lenses 4 and 5 collimate the electrons transmitted by the aperture 3, forming an electron beam EB. A first scanning magnetic deflector 70 comprising a core 6 and two coils 7 scans (deflects) the beam EB in the X direction. It will be readily apparent that the deflection may be in either the +X or −X directions; deflections in either direction will be referred to as being in the X direction. A second magnetic deflector 80 comprising the core 6 and two coils 8 then redirects the electron beam EB so that the beam propagates parallel to the optical axis AX. (The core 6 is shared by both deflectors 70, 80.) After deflection by the two deflectors 70, 80, the electron beam EB propagates generally parallel to but laterally displaced from the optical axis AX.

The first and second scanning magnetic deflectors 70, 80, respectively, deflect the collimated electron beam EB so that the beam irradiates a subfield 9 of a mask M. The mask M defines one or more patterns to be transferred to a sensitive substrate (e.g., a silicon wafer W).

FIG. 5 shows the mask M and the subfield 9 in more detail. The mask M is divided into multiple subfields; the subfield 9 shown in FIG. 5 and FIG. 1 is only one illustrative subfield.

The deflection of the electron beam EB by the deflectors 70, 80 depends, inter alia, on the amount of electrical current in the coils 7, 8, respectively, and on the profile of the coils. Referring again to FIG. 1, a deflection controller 10 controls the amount of beam deflection imparted by the deflectors 70, 80 by controlling the current in the coils 7, 8. A main controller 11 in turn controls the entire system, including the deflection controller 10, thereby selecting the subfield whose patterns are to be transferred.

After the electron beam EB passes through the subfield 9 of the mask M, correcting electrostatic deflectors 16, 17 displace the electron beam EB. The correcting electrostatic deflectors 16, 17 primarily provide small deflections and compensate for positional errors elsewhere in the system. For example, the correcting electrostatic deflectors 16, 17 displace the electron beam EB so that subfields on the mask M separated by boundary regions will be transferred without separation by boundary regions.

A scanning magnetic deflector 190 comprising a core 18, a pair of coils 19, and a set of four auxiliary coils 20 then deflects the electron beam EB in the X direction. The electron beam EB is subsequently redirected by yet another scanning magnetic deflector 210 comprising the coils 21. The deflector 210 redirects the electron beam EB so that the beam propagates along the optical axis AX.

The electron beam EB next passes through a projection lens 22 which forms a crossover CO of the electron beam. An objective lens 23 then receives the electron beam EB and forms an image of the subfield 9 with a magnification $\beta$ (where $\beta$ is, for example, ¼). In the preferred embodiment, the image is demagnified and inverted. The electron beam EB exits the objective lens 23 and proceeds along the optical axis AX. If there were no subsequent deflectors, the image of the subfield 9 would eventually be formed along the optical axis AX.

The electron beam EB is next deflected in the X direction by a scanning magnetic deflector 240 comprising a coil 24 and a magnetic pole piece 23a. Another magnetic deflector 250 comprising a core 25 and coils 26, 27 redirects the electron beam EB so that the beam once again propagates parallel to but displaced from the optical axis AX. The beam EB then passes through an octapole electrostatic deflector 28 and is approximately perpendicularly incident to an exposure region ("transfer subfield") 29 on the wafer W which is coated with an electron-beam-sensitive resist. The image of the subfield 9 by the projection lens 22 and the objective lens 23 appears on the exposure region 29.

The position of the exposure region 29 on the wafer W corresponds to the position of the subfield 9 on the mask M as imaged by the electron-beam optical system. The subfield 9 is imaged on the exposure region 29 with magnification $\beta$. Generally, the electron-beam optical system produces inverted images. Hence, the location of the exposure region 29 is inverted with respect to the optical axis AX and the image of the subfield in the exposure region 29 is inverted.

Generally, the magnetic deflectors 70, 240 deflect the beam away from the optical axis AX. It will be apparent that, if the subfield 9 is located on the optical axis, such deflection is unnecessary.

Figure 2:
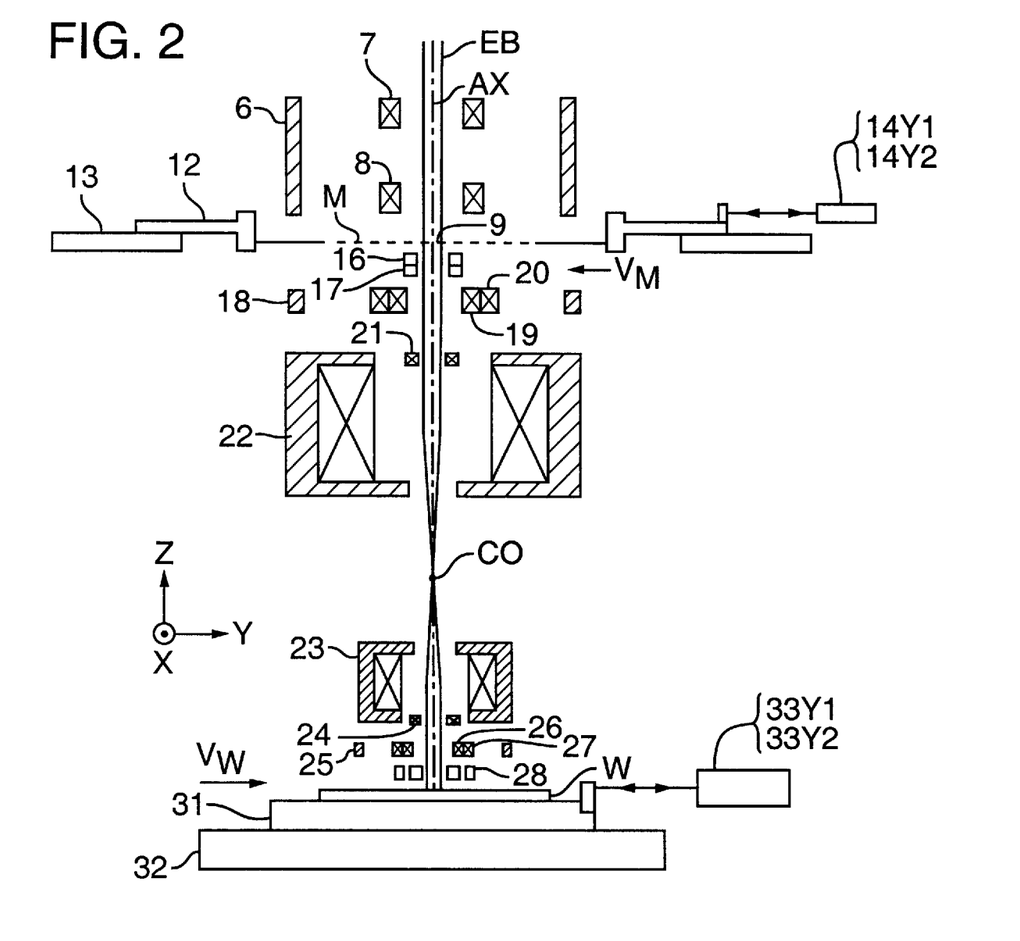
FIG. 2 shows the electron beam lithography system of FIG. 1 as viewed from the X direction.

The correcting electrostatic deflectors 16, 17 are preferably electrically conducting elements placed parallel to each other and perpendicular to the Z-axis. As shown by comparing FIGS. 1 and 2, these elements are elongated, extending a greater distance in the X direction than in the Y direction. A narrow gap along the Z-axis separates the correcting electrostatic deflectors 16, 17 from each other. The optical axis AX preferably passes through the center of these deflectors as shown in FIG. 2. The correcting electrostatic deflectors 16, 17 contain elongated apertures through which the electron beam EB passes.

The mask M and the wafer W are preferably mechanically scanned in the Y direction relative to each other. The correcting electrostatic deflectors 16, 17 correct the position of the image of the subfield 9 on the wafer W in the Y direction. If a pattern already transferred to the wafer W is shifted or rotated relative to the pattern on the image of the mask M, the octapole electrostatic deflector 28 provides a fine adjustment to the position and orientation of the image of the subfield 9 on the wafer W.

The octapole electrostatic deflector 28 maintains registration of the subfields by adjusting the position of the exposure region 29 slightly in the X and Y directions. Because the position adjustment is small (typically less than 5 $\mu$m), the single octapole electrostatic deflector 28 is adequate. Operation of the correcting electrostatic deflectors 16, 17, and the octapole electrostatic deflector 28 is controlled by a drive-deflection controller (not shown in the figures) which is, in turn, controlled by the main control system 11.

The main control system 11 controls a deflection controller 30 that regulates the electrical current in the coils 19, 20, 21, 24, 26, 27, thereby controlling the deflection produced by these coils.

As shown in FIG. 1, a mask stage 12 holds the mask M parallel to the XY plane on a mask base 13. A mask-stage drive system 15 moves the mask stage 12 continuously in the Y direction and in steps in the X direction. A laser interferometer 14X detects the X position of the mask stage 12 and sends the position data to the main control system 11.

A sample stand 31 holds the wafer W parallel to the XY plane on top of a movable stage 32. A wafer-stage drive system 34 drives the movable stage 32 continuously in the Y direction and in steps in the X direction. A laser interferometer 33X detects the X position of the sample stand 31 and sends the position data to the main control system 11.

As shown in FIG. 2, the laser interferometers 14Y1, 14Y2 detect the position of the mask stage 12 in the Y direction and send the position data to the main control system 11 of FIG. 1. The main control system 11 uses the average and difference of the position data from the two laser interferometers 14Y1, 14Y2 to determine the Y position and XY-plane rotation of the stage 12.

Two laser interferometers 33Y1, 33Y2 similarly detect the position and rotation of the sample stand 31 and output position data to the main control system 11 of FIG. 1. The main control system 11 uses the average value and difference of these two detection results to determine the Y position and the XY rotation of the sample stand 31.

Exposure data for the mask M, including the relative orientation of multiple transfer regions on the wafer W are supplied to the main control system 11. Based on this data, the main control system 11 controls the deflection of the electron beam EB in the X and Y directions with the deflection controllers 10, 30. In addition, by controlling the position of the mask M and the wafer W as well as rate at which they are driven by the mask stage and wafer stage drive systems 15, 34, respectively, an image of each subfield is transferred to the appropriate transfer region on the wafer W.

Figure 3:
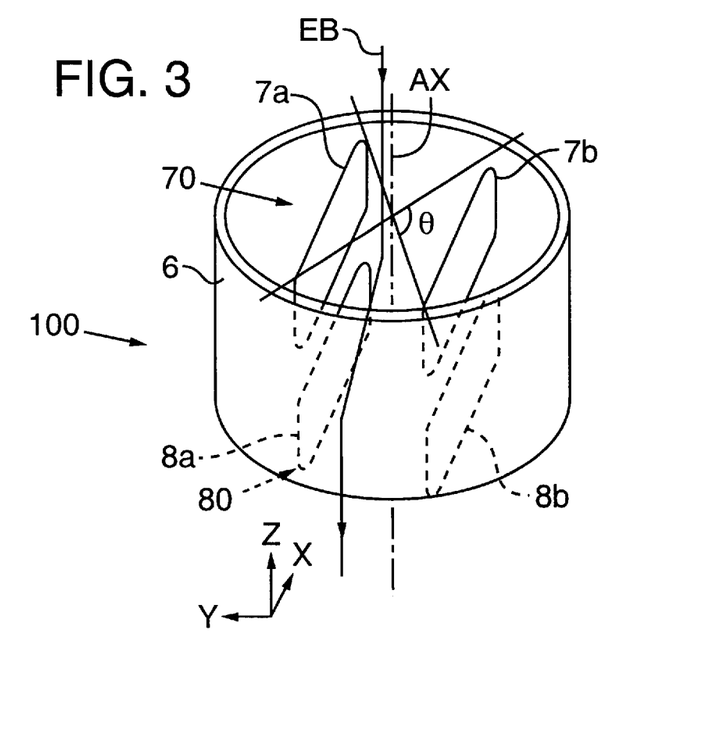
FIG. 3 is a magnetic deflector used in the electron beam lithography system of FIG. 1.

The construction of preferred embodiments of the magnetic deflectors according to the invention will now be described in detail. FIG. 3 shows in greater detail the magnetic deflectors 70, 80 made by the core 6 and the coils 7, 8, respectively. The core 6 is a cylindrical shell such as a "lens bore" or bore of a lens pole piece; the axis of the core 6 is colinear with the optical axis AX of the electron-beam optical system. In the FIG. 3 embodiment, the axis of the core is coaxial with the axis AX.

The coils 7 comprise a first coil 7a and a second coil 7b; these coils 7a, 7b are placed within the core 6 such that they are in planes parallel to and equidistant from a plane parallel to the XZ plane and containing the optical axis AX. The coils 7a, 7b face each other and are symmetrically placed opposite each other with respect to the optical axis AX.

The coils 7a, 7b are preferably longer in the X direction than in the Z direction; in the preferred embodiment the coils are rectangular except for the corners of the rectangles which are rounded. It will be apparent that other elongated shapes are appropriate. The coils need not be planar. Each of the coils 7a, 7b preferably comprises one or more turns of a suitable electrical conductor such as copper or silver.

As shown in FIG. 3, the angle $\theta$ between the ends of the coils 7a, 7b about the optical axis AX in a plane parallel to the XY plane is preferably greater than 120 degrees. That is, in general, the narrower the gap between the coils 7a, 7b, the better the characteristics of the deflector.

With respect to the deflector 80, the coils 8 comprise a first coil 8a and a second coil 8b that are also placed within the core 6. The first coil 8a is directly below and coplanar with the first coil 7a; the second coil 8b is directly below and coplanar with the second coil 7b. The coils 8a, 8b are equidistant from the optical axis AX just as are coils 7a, 7b. The coils 8a, 8b are also preferably elongated as are the coils 7a, 7b. In the preferred embodiment the coils 8a, 8b are rectangular with rounded corners.

The deflector 70 deflects the electron beam EB in the X direction; the deflector 80 redirects the electron beam EB along the optical axis AX. These two deflectors 70, 80 comprise a deflection unit 100 operable to displace the electron beam EB from the optical axis AX and then direct the beam parallel to the optical axis AX. This deflection unit 100 produces substantial deflections of the electron beam EB in the X direction.

The deflectors 70, 80 produce the necessary deflections as follows. Electrical current flowing in the coils 7a, 7b generate a magnetic field. The currents in the coils are generally equal in magnitude and are in the same direction, i.e., if current flow in the first coil 7a is clockwise, then current flow in the second coil 7b is also clockwise. In the space between the coils 7a, 7b, the magnetic field has a substantial component parallel to the Y-axis. The electron beam EB passes between the coils 7a, 7b along the optical axis AX and is deflected in the X direction by the Y component of the magnetic field. The currents in the coils 7a, 7b determine the magnitude and direction of the deflection.

Similarly, electrical currents in the coils 8a, 8b produce a magnetic field. In the space between the coils 8a, 8b, the magnetic field has a substantial component parallel to the Y-axis. The electron beam EB passes between the coils 8a, 8b at an angle with respect to the optical axis AX because of prior deflection of the beam by the coils 7a, 7b. The magnetic field between the coils 8a, 8b deflects the beam so that it propagates along an axis parallel to the optical axis AX.

Because the coils 7a, 7b are preferably closely spaced and parallel to each other, the magnetic field between them is nearly uniform. At locations between the coils 7a, 7b and close to an axis through the centers of both coils, the magnetic field is primarily parallel to the Y-axis and does not vary appreciably for points slightly displaced from this axis. As a result, the deflection sensitivity (i.e. the change in deflection angle as a function of electrical current in the coils) is nearly constant between the coils 7a, 7b.

The coils 8a, 8b are arranged similarly to the coils 7a, 7b. The deflection sensitivity of these coils is nearly constant between them. Therefore, the deflection unit 100 comprising the coils 7a, 7b, 8a, 8b, and the core 6 has high deflection sensitivity with a large region of uniform deflection. This deflection unit 100 allows large beam deflections without a need to increase the diameter or length of the core 6.

Narrowing the gap between the coils 7a, 7b and between the coils 8a, 8b increases the deflection sensitivity of the respective deflector. In addition, because the four coils (7a, 7b, 8a, 8b) share a common core 6, the construction of the deflection unit 100 is simple.

Figure 4:
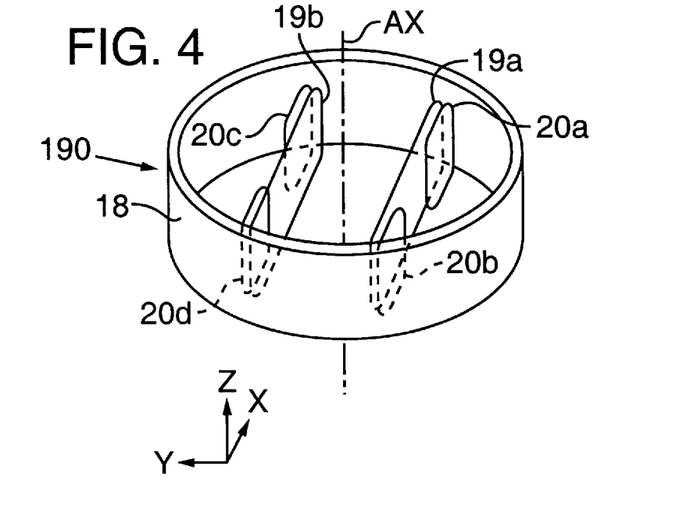
FIG. 4 is another magnetic deflector used in the electron beam lithography system of FIG. 1.

FIG. 4 shows the deflector 190 comprising the core 18, the pair of coils 19a, 19b, and the set of auxiliary coils 20a, 20b, 20c, 20d. The axially symmetric core 18 is a cylindrical shell (such as a "lens bore" or a bore of a lens pole piece) preferably made of ferrite; the axis of the core 18 is placed coaxially with the optical axis AX. Other suitable core materials can be selected from the ferromagnetic materials. The coils 19a, 19b are in planes parallel to the XZ plane and equidistant from the optical axis AX. Flow of electrical current in the coils 19a, 19b generates a magnetic field that deflects the electron beam EB in the X direction. These coils 19a, 19b produce a wide region of uniform deflection in the same fashion as the deflector 70 or the deflector 80. The magnitude and direction of the electrical current in the coils 19a, 19b determine the direction and magnitude of the beam deflection imparted by them.

The pair of coils 19a, 19b provides a region of uniform deflection. The auxiliary coils 20a–20d increase the region of uniform deflection. The auxiliary coils 20a, 20c have areas much smaller than the areas (magnetic-flux areas) of the coils 19a, 19b. The coils 20a and 20d, and the coils 20b and 20c, are placed symmetrically about the optical AX, respectively, and preferably farther from the optical axis AX than the coils 19a, 19b. The side edges of the coils 20a, 20c are positioned proximal to the side edges of the coils 19a, 19b, respectively. The auxiliary coils 20b, 20d are positioned similarly to the coils 20a, 20c, respectively; but, the side edges of the coils 20b, 20d are placed proximal to the other side edges of the coils 19a, 19b, respectively.

The four auxiliary coils 20a–20d preferably have approximately equal areas. Electrical currents in the auxiliary coils 20a, 20b, 20c, 20d increase the magnetic field near the side edges of the coils 19a, 19b while simultaneously increasing the size of the uniform deflection region.

The deflector 210 shown in FIG. 1 comprises the coils 21 which actually comprise a pair of coils placed symmetrically in planes parallel to the XZ plane and equidistant from the optical axis AX, similar to the arrangement of the pair of coils 19a, 19b. The coils 21 are placed between the optical axis AX and a magnetic pole piece 22a on the upper side of the projection lens 22. The magnetic pole piece 22a acts as a core for the coils 21; the projection lens 22 also utilizes the same core. As is readily apparent, the magnetic deflector 210 is similar to the deflectors 70, 80. Hence, the deflector 210 has a wide region of uniform deflection sensitivity.

After being deflected by the deflector 210, the electron beam EB that has passed through the subfield 9 is deflected so as to propagate along the optical axis AX. The electron beam EB then passes through the projection lens 22 and the objective lens 23 (FIG. 1). The electron beam EB is then deflected again in order to image the subfield 9 (at nearly perpendicular incidence) on the wafer (substrate) in the exposure region 29.

The coil 24 preferably comprises a pair of coils such as 7a 7b or 8a, 8b.

The deflector 240 of FIG. 1 is situated near the underside of the objective lens 23 symmetrically about the optical axis AX. The deflector 240 deflects the electron beam EB and comprises the magnetic pole piece 23a of the projection lens 23 for use as a core.

The magnetic deflector 250 comprises the core 25 and the coils 26, 27. The coil 26 actually comprises a pair of coils configured similarly to the coils 19a, 19b. The four auxiliary coils 27 are likewise oriented in a similar manner to the coils 20. The deflector 250 has a wide region of uniform deflection sensitivity.

The magnetic deflector 190 and the magnetic deflector 210 are situated such that their deflection angles are equal to the deflection angles of the magnetic deflector 240 and the magnetic deflector 250, respectively. Such an arrangement effectively cancels any deflection aberrations arising in any of these deflectors.

The projection lens 22 and the objective lens 23 form a symmetrical magnetic doublet. Hence, net aberrations due to these lenses are small. Furthermore, the core 18 near the projection lens 22 is axially symmetric and the radius of the core 18 is larger than the bore radius of the magnetic pole piece 22a of the projection lens 22. The core 25 near the objective lens 23 is axially symmetric and the radius of the core 25 is larger than the bore radius of the magnetic pole piece 23a of the objective lens 23. Hence, the cores 18 and 25 do not increase the aberrations of the projection lens 22 or the objective lens 23.

The orientation of the mask M and the exposure region 29 on the wafer W will be described with reference to FIG. 5. The mask M is divided into main fields 41A, 41B, 41C, . . . , separated by boundary regions 42A, 42B, 42C, . . . The main fields contain patterns to be transferred to the wafer W. The main fields are rectangular with their longest sides parallel to the X-axis. The boundary regions do not contain patterns and generally either block or scatter the electron beam. The Y width of the main fields is dY1 and Y spacing between the main fields is dY2. The electron beam EB irradiates the subfield 9 which is wide enough to cover the Y width dY1 of the main fields. The width dY1 of the main fields 41A, 41B, 41C, . . . is typically a few millimeters. The subfield 9 is a representative subfield; the main fields are divided into numerous other subfields.

The mask M may be a scattering mask wherein a thin film such as silicon nitride (SiN) forms a portion of the mask which transmits the electron beam. A thin film of an electron-beam-scattering material such as tungsten is deposited on the surface of the SiN film. The scattering tungsten layer is patterned to contain the patterns to be transferred to the wafer W. The mask M may also be a perforated-stencil mask wherein patterns are formed by perforations in an electron-scattering substrate such as silicon. It will be readily apparent that other types of masks can be used.

The pattern of the subfield 9 is transferred onto the rectangular exposure region 29 on the wafer W. The two magnetic deflectors consisting of the core 6 and the coils 7 and 8 scan the electron beam EB in the X direction thereby covering any of the subfields within a main field. The magnetic deflector 190 causes the electron beam to scan the rectangular exposure region 29 on the wafer W in the X direction.

The patterns within the main fields 41A, 41B, 41C, . . . of the mask M are transferred to the rectangular-shaped main exposure regions 44A, 44B, 44C, . . . The main fields 41A, 41B, 41C, . . . , of the mask M are partitioned on their Y-facing edges by the boundary regions 42A, 42B, 42C, . . . In contrast, the corresponding main exposure regions 44A, 44B, 44C, . . . on the wafer W join directly without corresponding partitions. The correcting electrostatic deflectors 16 and 17 serve chiefly to deflect the electron beam EB so that the main exposure regions 44A, 44B, 44C, . . . , join without any boundary regions.

The pattern-transfer operation of the preferred embodiment will be described with reference to FIG. 2. The system transfers the subfields of the mask M to the exposure region of the wafer W while the wafer W is mechanically scanned in a direction parallel to the Y-axis at a speed $V_W$. The mask is synchronously mechanically scanned in the opposite direction at a speed $V_M$. The scanning directions of the mask M and the wafer W are opposite because the projection lens 22 and the objective lens 23 form an inverted image of the secondary region 9.

The demagnification of the electron-beam optical system from the mask M to the wafer W is β. The Y width of the main fields 41A, 41B, 41C, . . . , on the mask M is dY1; the Y width of the boundary regions 42A, 42B, 42C, . . . , is dY2. Because the boundary regions are not transferred to the wafer, it is preferable to adjust the relationship between the wafer-scanning speed $V_W$ and the mask-scanning speed $V_M$ to account for this. Therefore $V_M$ and $V_W$ are related as follows:

$$V_W = \beta[dY1/(dY1+dY2)]V_M \quad (1)$$

During the mechanical scan of the mask and wafer in the Y direction, the electron beam EB is scanned along the X direction to irradiate the subfields associated with each main field of the mask M. For example, the subfield 9 of the main field 41A as shown in FIG. 5 must be deflected along the X direction so that all the subfields of the main field 41A are transferred to the wafer. After the transfer of one main field is complete, the electron beam is deflected to begin transfer of another main field. In this way, the exposure region 29 is scanned and all the subfields of the entire mask are transferred to the wafer W.

The pattern transfer described above is carried out while correcting for electron-optical system aberrations and focal shifts in the images, which generally vary with location on the mask and wafer. These corrections permit transfers with improved resolution and positional accuracy (registration) to be carried out optically over a wider region than in batch transfer systems.

In the preferred embodiment the mask M and the wafer W are mechanically scanned along the Y direction. In addition, the electron beam EB is scanned in the X direction. Pattern transfer is carried out by scanning the subfield 9 over a main field that has reached a position almost crossing the optical axis AX. Therefore, the regions to be transferred from the mask M are in a narrow region approximately a few millimeters from the optical axis.

Because the magnetic deflector 70, according to a preferred embodiment, comprises the coils 7a and 7b oppositely arranged inside the core 6 with a narrow gap along the Y direction with the optical axis midway between the coils, the deflector 70 can cause large deflections of the electron beam over a relatively long distances along the X direction.

As shown in FIG. 1, after the electron beam EB passes through the subfield 9 on the mask M, the beam is deflected toward and along the optical axis AX through the magnetic deflectors 190, 210, and the correcting electrostatic deflectors 16 and 17. The projection lens 22 and the objective lens 23 form a demagnified image of the subfield 9. This image is centered approximately along the optical axis AX. After passing through the lenses 22, 23, the electron beam EB is again deflected away from the optical axis AX. Although the overall length of the electron-optical system is shortened, because the beam EB passes through the lenses 22, 23 near the optical axis AX, image aberrations are small. The distance between the mask M and the wafer W is therefore shortened without increasing transfer aberrations. Shorter distances reduce image blurring caused by the space-charge effect. Therefore, the intensity of the electron beam can be increased, increasing pattern-transfer throughput. In addition, the size of the pattern-transfer system can be reduced.

In the preferred embodiment the mask M is divided into a plurality of main fields 41A, 41B, 41C, . . . which extend farther in the X direction than in the Y direction. The main fields are spaced evenly along the Y-axis. The main fields 41A, 41B, 41C . . . can be further divided into subfields 9 with a uniform spacing relative to each other in the X direction. The subfields of the mask M can be transferred in sequence onto the wafer W, wherein the electron beam EB is moved in step-and-repeat fashion from one subfield to the next using the magnetic deflectors of the preferred embodiment. Alternatively, the electron beam can be scanned while the mask stage and the sample stand 31 move in the X direction using the step-and-repeat method in which each subfield moves to a region including the optical axis AX before the exposure of the subfield occurs.

It will be apparent to those skilled in the art that the present invention applies to charged-particle pattern-transfer systems using other charged particle beams such as ion beams. In addition, the cores of the deflectors can be made of magnetic materials other than ferrites. Furthermore, it will be readily appreciated that the coils can comprise one or more turns of an electrically conductive material.

In view of the many possible embodiments to which the principles of the invention may be applied, it should be recognized that the illustrated embodiments are only preferred embodiments of the invention and should not be regarded as limiting the scope of the following claims. We claim as the invention all that comes within the scope of these claims.

What is claimed is:

1. A magnetic deflector for deflecting a charged particle beam in a deflection direction, comprising:
    (a) a magnetic core that is situated on and rotationally symmetric about a symmetry axis;
    (b) first and second electrically conductive coils placed symmetrically within the core, each coil being planar and the first and second coils being disposed in the core such that the first and second coils face each other in parallel planes that are equidistant from the symmetry axis, wherein the first and second coils are elongated in an elongation direction perpendicular to the symmetry axis and parallel to the deflection direction;

(c) the first and second coils being operable, in conjunction with the core, to generate a substantially uniform magnetic field between the first and second coils when an electrical current is flowed through the first and second coils, the magnetic field being sufficient to cause a charged particle beam propagating axially through the deflector between the first and second coils to be deflected in a direction parallel to the coils.

2. The magnetic deflector of claim 1, further comprising a deflection controller electrically connected to the first and second coils, the deflection controller being operable to cause an electrical current to flow through the first and second coils.

3. The magnetic deflector of claim 2, wherein the deflection controller is operable to generate a variable electrical current so as to cause a charged particle beam propagating axially through the deflector between the first and second coils to be variably deflected.

4. The magnetic deflector of claim 1, wherein the first and second coils are made of a material selected from a group consisting of copper and silver.

5. The magnetic deflector of claim 1, wherein the core comprises a lens bore or a bore of a lens pole piece.

6. The magnetic deflector of claim 1, wherein the first coil subtends an angle of at least 120 degrees about the symmetry axis in a plane perpendicular to the symmetry axis.

7. The magnetic deflector of claim 1, wherein the first and second coils are arranged to conduct an electrical current in the same directions.

8. The magnetic deflector of claim 1, further comprising an auxiliary coil having an area smaller than the area of either of the first and second coils, the auxiliary coil being placed proximal to one of the first and second coils, the auxiliary coil being operable to conduct an electrical current.

9. The magnetic deflector of claim 8, further comprising a deflection controller electrically connected to the first and second coils and to the auxiliary coil, the deflection controller being operable to cause an electrical current to flow through the first and second coils and through the auxiliary coil.

10. A magnetic deflector for deflecting a charged particle beam, comprising:

(a) a magnetic core that is axially symmetric about a symmetry axis;

(b) pair of primary coils comprising a first primary coil and a second primary coil placed symmetrically within the core such that the first and second primary coils face each other in parallel planes and are equidistant from the symmetry axis, the primary coils being operable to conduct an electrical current;

(c) a first pair of auxiliary coils associated with the first primary coil and situated proximal to the first primary coil within the core, the first pair of auxiliary coils being operable to conduct an electrical current;

(d) a second pair of auxiliary coils associated with the second primary coil and situated proximal to the second primary coil within the core, the second pair of auxiliary coils being operable to conduct an electrical current; and (e) the primary coils and the auxiliary coils being operable, whenever a charged particle beam is propagating between the first and second primary coils and between the first and second pair of auxiliary coils parallel to the plane of the coils, and whenever the coils are conducting an electrical current, to deflect the charged particle beam in a direction parallel to the coils.

11. The magnetic deflector of claim 10, further comprising a deflection controller connected to the coils and being operable to cause an electrical current to flow through the primary and auxiliary coils.

12. The magnetic deflector of claim 11, wherein the deflection controller is operable to cause a variable electrical current to flow through the coils.

13. The magnetic deflector of claim 10, wherein the core comprises a lens bore or a bore of a lens pole piece.

14. The magnetic deflector of claim 10, wherein the first and second pairs of auxiliary coils are situated equidistantly from the symmetry axis of the core.

15. The magnetic deflector of claim 10, wherein the first and second primary coils are elongated in a direction perpendicular to the symmetry axis of the core.

16. The magnetic deflector of claim 15, wherein the first and second pairs of auxiliary coils are elongated in a direction perpendicular to the symmetry axis of the core.

17. The magnetic deflector of claim 15 further wherein the first and second primary coils are rectangular in profile.

18. In a magnetic deflection unit for deflecting and displacing a beam of charged particles in a deflection direction, the deflection unit comprising a first deflector and a second deflector operable to deflect the beam of charged particles within a plane, an improvement wherein each of the first and second deflectors comprises a magnetic core situated on and rotationally symmetric about an axis, a first primary coil, and a second primary coil, the first and second primary coils being elongated and situated symmetrically within the core such that the first and second primary coils face each other in parallel planes that are equidistant from the axis, the elongation of the coils being perpendicular to the axis and parallel to the deflection direction.

19. The magnetic deflection unit of claim 18, further comprising a deflection controller connected to each of the coils and operable to pass electrical currents in the coils such that the first deflector deflects the charged particle beam in a first direction in a plane parallel to the plane of the coils and the second deflector deflects the charged particle beam in a second direction so that the charged particle beam subsequently propagates in a direction parallel to the direction in which it was propagating before deflection by the first deflector.

20. The magnetic deflection unit of claim 18, further comprising:

(a) a first pair of auxiliary coils associated with the first primary coil and placed proximal to the first primary coil within the core;

(b) a second pair of auxiliary coils associated with the second primary coil and placed proximal to the second primary coil within the core.

21. A charged-particle-beam lithography system for deflecting a charged particle beam in order to transfer patterns from a mask to a sensitized substrate, the charged-particle-beam lithography system comprising a magnetic deflection unit as recited in claim 18.

22. A charged-particle-beam lithography system for transferring patterns from a mask to a sensitized substrate, the lithography system comprising:

(a) a charged-particle condenser system which forms a charged particle beam from a source of charged particles;

(b) a charged-particle-beam optical system situated on an axis relative to the charged-particle condenser system and being operable, using the charged particle beam, to form an image of a region of the mask on the substrate;

(c) a charged-particle-beam scanning system situated on the axis, the scanning system being operable to direct the charged particle beam so that the beam irradiates a selected region on the mask and directs an image of the selected region, the image formed by the optical system, to a corresponding selected region on the substrate, the scanning system comprising (i) a magnetic core situated on and rotationally symmetric about the axis; and (ii) a first primary coil and a second primary coil which are placed symmetrically within the core such that the first and second primary coils face each other in parallel planes that are equidistant from the axis and are elongated in a direction perpendicular to the axis and parallel to a deflection direction parallel to the planes of the coils; and (d) a deflection controller connected to the first and second primary coils so as to cause a variable electrical current to flow through the first and second primary coils, thereby causing the charged particle beam propagating between and parallel to the first and second primary coils to be variably deflected in the deflection direction by varying the electrical currents in the coils.

23. The charged-particle-beam lithography system of claim 22, wherein the charged-particle-beam scanning system further comprises (i) a first pair of auxiliary coils associated with the first primary coil and situated proximal to the first primary coil within the core, the first pair of auxiliary coils being connected to and controllable by the deflection controller; and (ii) a second pair of auxiliary coils associated with the second primary coil and placed proximal to the second primary coil within the core, the second pair of auxiliary coils being connected to and controllable by the deflection controller.

24. The charged-particle-beam lithography system of claim 22, wherein the scanning system further comprises (i) an auxiliary coil with an area smaller than the area of one of the first and second primary coils, the auxiliary coil being situated proximal to one of the first and second primary coils, the auxiliary coil being connected to the deflection controller which is operable to controllably cause an electrical current to flow in the auxiliary coil.

25. In a charged-particle-beam lithography system for deflecting a charged particle beam in order to transfer a pattern from a mask to a sensitized substrate by mechanically translating the mask or the wafer in a first direction and electromagnetically scanning the charged particle beam in a second direction perpendicular to the first direction, a magnetic deflector comprising:

(a) a core having an axis and comprising a lens bore or a bore of a lens pole piece, the core being rotationally symmetric about the axis;

(b) first and second primary coils that are situated symmetrically within the core such that the first and second primary coils face each other in parallel planes and are equidistant from the axis of the core and are elongated in a direction perpendicular to the axis of the core and parallel to the second direction; and (c) a deflection controller electrically connected to the first and second primary coils, the deflection controller being operable to cause an electrical current to flow in the first and second primary coils so as to cause a charged particle beam passing through the magnetic deflector to be deflected relative to the axis.

26. The charged-particle-beam lithography system of claim 25, wherein the magnetic deflector further comprises:

(i) a first pair of auxiliary coils associated with the first primary coil and situated proximal to the first primary coil within the core, the first pair of auxiliary coils being connected to and controllable by the deflection controller; and (ii) a second pair of auxiliary coils associated with the second primary coil and situated proximal to the second primary coil within the core, the second pair of auxiliary coils being connected to and controllable by the deflection controller.

27. A magnetic deflector for deflecting a charged particle beam, comprising:

(a) a magnetic core that is axially symmetric about a symmetry axis;

(b) first and second electrically conductive coils placed symmetrically within the core, each coil being planar, and each coil being disposed in the core such that the first and second coils face each other in parallel planes that are equidistant from the symmetry axis;

(c) the first and second coils being operable, in conjunction with the core, to generate a substantially uniform magnetic field between the first and second coils when an electrical current is flowed through the first and second coils, the magnetic field being sufficient to cause a charged particle beam propagating axially through the deflector between the first and second coils to be deflected in a direction parallel to the first and second coils; and (d) an auxiliary coil having an area smaller than the area of either of the first and second coils, the auxiliary coil being placed proximal to one of the first and second coils and being operable to conduct an electrical current.

28. The magnetic deflector of claim 27, further comprising a deflection controller electrically connected to the first and second coils and to the auxiliary coil, the deflection controller being operable to cause an electrical current to flow through the first and second coils and through the auxiliary coil.

29. In a magnetic deflection unit for deflecting and displacing a beam of charged particles and comprising a first deflector and a second deflector operable to deflect the beam of charged particles within a plane, an improvement wherein:

(a) each of the first and second deflectors comprises a magnetic core comprising a cylindrical shell of ferrite, a first primary coil, and a second primary coil, the first and second primary coils being elongated and situated symmetrically within the core such that the first and second primary coils face each other in parallel planes that are equidistant from the axis of the core, the elongation of the first and second primary coils being perpendicular to the axis of the core; and (b) the magnetic deflection unit further comprises:

(i) a deflection controller connected to each of the first and second primary coils and operable to pass electrical currents in the first and second primary coils such that the first deflector deflects the charged particle beam in a first direction in a plane parallel to the planes of the first and second primary coils, and the second deflector deflects the charged particle beam in a second direction so that the charged particle beam subsequently propagates in a direction parallel to the direction in which it was propagating before being deflected by the first deflector;

(ii) a first pair of auxiliary coils associated with the first primary coil and placed proximal to the first primary coil within the core; and (iii) a second pair of auxiliary coils associated with the second primary coil and placed proximal to the second primary coil within the core.

30. A charged-particle-beam lithography system for transferring patterns from a mask to a sensitized substrate, the lithography system comprising:

(a) a charged-particle condenser system that forms a charged particle beam from a source of charged particles;

(b) a charged-particle-beam optical system situated on an axis relative to the charged-particle condenser system, the charged-particle-beam optical system being operable to form an image of a region of the mask on the substrate using the charged particle beam;

(c) a charged-particle-beam scanning system situated on the axis, the scanning system being operable to direct the charged particle beam so that the beam irradiates a selected region on the mask and directs an image of the selected region to be formed by the charged-particle-beam optical system on a corresponding selected region on the substrate, the scanning system comprising (i) a cylindrical magnetic core situated on the axis; and (ii) a first primary coil and a second primary coil placed symmetrically within the core such that the first and second primary coils face each other in parallel planes that are equidistant from the axis of the core;

(d) a deflection controller connected to the first and second primary coils so as to cause a variable electrical current to flow through the first and second primary coils, thereby causing the charged particle beam propagating between and parallel to the first and second primary coils to be variably deflected in a direction parallel to the planes of the first and second primary coils by varying the electrical currents in the first and second primary coils;

(e) a first pair of auxiliary coils associated with the first primary coil and situated proximal to the first primary coil within the core, the first pair of auxiliary coils being connected to and controllable by the deflection controller; and (f) a second pair of auxiliary coils associated with the second primary coil and placed proximal to the second primary coil within the core, the second pair of auxiliary coils being connected to and controllable by the deflection controller.

31. The charged-particle-beam lithography system of claim 30, wherein the scanning system further comprises a third auxiliary coil having an area smaller than an area of one of the first and second primary coils, the third auxiliary coil being situated proximal to one of the first and second primary coils and being connected to the deflection controller, the deflection controller being operable to controllably cause an electrical current to flow in the third auxiliary coil.

32. In a charged-particle-beam lithography system for deflecting a charged particle beam in order to transfer a pattern from a mask to a sensitized substrate, a magnetic deflector comprising:

(a) a core having an axis and comprising a lens bore or a bore of a lens pole piece;

(b) first and second primary coils that are situated symmetrically within the core such that the first and second primary coils face each other in parallel planes and are equidistant from the axis of the core and such that the direction of elongation of the first and second primary coils is perpendicular to the axis of the core;

(c) a deflection controller electrically connected to the first and second primary coils, the deflection controller being operable to cause an electrical current to flow in the first and second primary coils so as to cause a charged particle beam passing through the magnetic deflector to be deflected relative to the axis;

(d) a first pair of auxiliary coils associated with the first primary coil and situated proximal to the first primary coil within the core, the first pair of auxiliary coils being connected to and controllable by the deflection controller; and (e) a second pair of auxiliary coils associated with the second primary coil and situated proximal to the second primary coil within the core, the second pair of auxiliary coils being connected to and controllable by the deflection controller.

* * * * *